(12) United States Patent
Su et al.

(10) Patent No.: US 10,462,929 B1
(45) Date of Patent: Oct. 29, 2019

(54) COOLING OF A COMPACT ELECTRONIC DEVICE

(71) Applicant: Plume Design, Inc., Palo Alto, CA (US)

(72) Inventors: Ming-Tsung Su, Taipei (TW); Brian Nam, San Jose, CA (US); Shu-Chun Shen, Taipei (TW); Nora Yan, Taipei (TW); Irene Yang, Sunnyvale, CA (US); Richard Chang, Sunnyvale, CA (US); Duc Minh Nguyen, San Jose, CA (US); Jeffrey ChiFai Liew, Millbrae, CA (US); Liem Hieu Dinh Vo, San Jose, CA (US); William McFarland, Portola Valley, CA (US)

(73) Assignee: Plume Design, Inc., Palo Alto, CA (US)

( * ) Notice: Subject to any disclaimer, the term of this patent is extended or adjusted under 35 U.S.C. 154(b) by 0 days.

(21) Appl. No.: 16/000,224

(22) Filed: Jun. 5, 2018

(51) Int. Cl.
*H05K 7/20* (2006.01)
*H01Q 13/10* (2006.01)
(Continued)

(52) U.S. Cl.
CPC ......... *H05K 7/20145* (2013.01); *H01Q 13/10* (2013.01); *H05K 5/0069* (2013.01);
(Continued)

(58) Field of Classification Search
CPC .............. G06F 1/20; G06F 1/203; H05K 7/20136–20163; H04W 88/08–10
(Continued)

(56) References Cited

U.S. PATENT DOCUMENTS 6,058,011 A * 5/2000 Hardt ...................... G06F 1/183
165/104.33
6,741,470 B2 * 5/2004 Isenburg ............. H01L 23/4093
165/80.3
(Continued)

FOREIGN PATENT DOCUMENTS

CN 205304850 U 6/2016
CN 205847310 U 12/2016

OTHER PUBLICATIONS

Jun. 26, 2017 International Search Report for International Application PCT/US2017/023130.
(Continued)

*Primary Examiner* — Zachary Pape
(74) *Attorney, Agent, or Firm* — Clements Bernard Walker PLLC; Lawrence A. Baratta, Jr.

(57) ABSTRACT

A compact electronic device includes a base with a plurality of sides each adjacent to a bottom portion, wherein the base houses components comprising a heatsink supporting a fan module located in an interior portion, a Printed Circuit Board (PCB), and a power supply, and wherein vents are disposed on the bottom portion and side vents are disposed on one or more of the plurality of sides; a top cover configured to attach to the base via the plurality of sides forming an air gap extending each of the plurality of sides, wherein the air gap supports air exhaust on one or more sides of the plurality of sides and air intake on the remaining sides; and an electrical plug connected to the power supply and extending out of the bottom portion for insertion into an electrical outlet for power and to physically support the compact electronic device.

18 Claims, 12 Drawing Sheets

(51) Int. Cl.
*H04W 88/08* (2009.01)
*H05K 5/00* (2006.01)

(52) U.S. Cl.
CPC ..... *H05K 7/20154* (2013.01); *H05K 7/20172* (2013.01); *H05K 7/20509* (2013.01); *H04W 88/08* (2013.01)

(58) Field of Classification Search
USPC .............. 361/679.46–679.54, 688–723
See application file for complete search history.

(56) References Cited

U.S. PATENT DOCUMENTS

| | | | |
|---|---|---|---|
| 7,256,996 B2 * | 8/2007 | Egbert | H05K 7/20154 165/185 |
| 7,315,533 B2 | 1/2008 | Theobold et al. | |
| 7,341,698 B2 * | 3/2008 | Pedrotti | A01M 1/2072 239/34 |
| 7,414,978 B2 | 8/2008 | Lun et al. | |
| 7,953,403 B2 | 5/2011 | Nientiedt | |
| 8,233,803 B2 * | 7/2012 | Meyer | G08C 17/02 398/106 |
| 8,514,574 B2 * | 8/2013 | Fu | G06F 1/20 165/104.33 |
| 8,798,021 B2 | 8/2014 | Mangalvedhe et al. | |
| 8,981,218 B1 | 3/2015 | Kono et al. | |
| 9,060,279 B2 | 6/2015 | Ganu et al. | |
| 9,066,251 B2 | 6/2015 | Madan et al. | |
| 9,073,123 B2 * | 7/2015 | Campbell | B22F 3/225 |
| 9,131,391 B2 | 9/2015 | Madan et al. | |
| 9,131,392 B2 | 9/2015 | Madan et al. | |
| 9,420,528 B2 | 8/2016 | Madan et al. | |
| 9,497,700 B2 | 11/2016 | Madan et al. | |
| 9,510,214 B1 | 11/2016 | Balasubramaniam et al. | |
| 9,516,579 B1 | 12/2016 | Diner et al. | |
| 2006/0120043 A1 * | 6/2006 | Wolford | H05K 1/0272 361/695 |
| 2006/0121421 A1 * | 6/2006 | Spitaels | G06F 1/206 434/118 |
| 2006/0258395 A1 | 11/2006 | Cave et al. | |
| 2007/0149172 A1 | 6/2007 | Dickinson | |
| 2007/0242621 A1 | 10/2007 | Nandagopalan et al. | |
| 2009/0257380 A1 | 10/2009 | Meier | |
| 2009/0279427 A1 | 11/2009 | Ji et al. | |
| 2009/0316585 A1 | 12/2009 | Srinivasan | |
| 2009/0323632 A1 | 12/2009 | Nix | |
| 2010/0029282 A1 | 2/2010 | Stamoulis et al. | |
| 2011/0039554 A1 | 2/2011 | Bims | |
| 2011/0119370 A1 | 5/2011 | Huang et al. | |
| 2011/0151886 A1 | 6/2011 | Grayson et al. | |
| 2012/0002567 A1 | 1/2012 | Sun et al. | |
| 2012/0087268 A1 | 4/2012 | Savoor et al. | |
| 2012/0122503 A1 | 5/2012 | Ma et al. | |
| 2012/0257585 A1 | 10/2012 | Sydor et al. | |
| 2013/0201857 A1 | 8/2013 | Bhargava et al. | |
| 2013/0272285 A1 | 10/2013 | Goldsmith et al. | |
| 2014/0092765 A1 | 4/2014 | Agarwal et al. | |
| 2014/0116772 A1 | 5/2014 | Shrum, Jr. et al. | |
| 2014/0126410 A1 | 5/2014 | Agarwal et al. | |
| 2014/0321325 A1 | 10/2014 | Jing et al. | |
| 2014/0328190 A1 | 11/2014 | Martin et al. | |
| 2015/0341797 A1 | 11/2015 | Madan et al. | |
| 2016/0044447 A1 | 2/2016 | Tetreault et al. | |
| 2016/0080949 A1 | 3/2016 | Chandrasekhar et al. | |
| 2017/0272317 A1 | 9/2017 | Singla et al. | |
| 2019/0190115 A1 * | 6/2019 | Samardzija | H01Q 1/02 |

OTHER PUBLICATIONS

Sep. 20, 2019, International Search Report and Written Opinion issued for International Application No. PCT/US2019/034512.

* cited by examiner

COOLING OF A COMPACT ELECTRONIC DEVICE

FIELD OF THE DISCLOSURE

The present disclosure generally relates to a wireless networking device. More particularly, the present disclosure relates to systems and methods for cooling a compact electronic device, such as a wireless access device.

BACKGROUND OF THE DISCLOSURE

Wi-Fi networks (i.e., Wireless Local Area Networks (WLAN) based on the IEEE 802.11 standards) have become ubiquitous. People use them in their homes, at work, and in public spaces such as schools, cafes, even parks. Wi-Fi provides great convenience by eliminating wires and allowing for mobility. The applications that consumers run over Wi-Fi is continually expanding. Today people use Wi-Fi to carry all sorts of media, including video traffic, audio traffic, telephone calls, video conferencing, online gaming, and security camera video. Often traditional data services are also simultaneously in use, such as web browsing, file upload/download, disk drive backups, and any number of mobile device applications. In fact, Wi-Fi has become the primary connection between user devices and the Internet in the home or other locations. The vast majority of connected devices use Wi-Fi for their primary network connectivity. As such, Wi-Fi access devices, namely Wi-Fi Access Points (APs) are deployed in a distributed fashion in a location (home, office, etc.).

The trend in consumer electronics design and the like is for aesthetically pleasing hardware form factors in a small and compact manner. For example, a distributed Wi-Fi system includes a number of Wi-Fi APs distributed around a location such as a residence. However, placing a number of APs around a house puts additional pressure on making the APs small, attractive, and without vent holes that are visible and annoying to the consumer (e.g., unique industrial design). Such small APs, with an appealing, compact industrial design, raise significant issues with respect to cooling, airflow, etc.

BRIEF SUMMARY OF THE DISCLOSURE

In an embodiment, a Wireless Access Point includes a housing including a plurality of sides each adjacent to a bottom portion, wherein the base houses a plurality of components including a fan module, a Printed Circuit Board (PCB) including one or more Wi-Fi radios, and a power supply; and an electrical plug connected to the power supply and extending from the bottom portion for insertion into an electrical outlet for power and for physical support of the Wireless Access Point adjacent to the electrical plug. The Wireless Access Point can further include a plurality of vents disposed about the housing which are hidden from view when the Wireless Access Point is plugged into the electrical plug.

The Wireless Access Point can further include a top portion disposed to or attached to the housing at the plurality of sides, wherein an air gap is formed between the top portion and the housing, wherein the air gap supports air exhaust on one or more sides of the plurality of sides and air intake on the remaining sides of the plurality of one or more sides. The top portion can include a wall which divides airflow between the air exhaust on the one or more side and the air intake on the remaining sides, and wherein the wall is formed in the top portion. The top portion can include a double wall which divides airflow between the air exhaust on the one or more side and the air intake on the remaining sides, and wherein the double wall can include two substantially shaped walls spaced apart and formed in the top portion. The air gap can further operate as a slot antenna.

The Wireless Access Point can further include vents disposed on the housing on a surface that is recessed from the bottom portion with the electrical plug to provide a gap for air circulation. The air intake from the vents can be a Z-shaped flow through the housing. The PCB can include an opening for airflow from the vents to the fan module located above the PCB. The Wireless Access Point can further include a heatsink supporting the fan module, wherein the fan module is located in an interior of the housing. The fan module can be disposed adjacent to fins attached or soldered to the heatsink, wherein the fins direct the air exhaust. A fan and fan shroud can be a separate assembly from the fins. A wall associated with the heatsink can be utilized as a portion of a fan shroud for the fan module.

The Wireless Access Point can further include vents disposed on the housing on a surface that is recessed from the bottom portion with the electrical plug to provide a gap for air circulation; and a heatsink supporting the fan module, wherein the fan module is located in an interior of the housing, wherein air intake from the vents is guided between layers of the plurality of components via gaps in edges of the heat sink. The Wireless Access Point can further include one or more cable connector ports on the housing each with an air gap for air intake. A Light Emitting Diode (LED) can be positioned on the PCB and configured to shine through holes in the fan module. The LED can shine through a hole in the housing which is sealed off from leakage by a light pipe. The fan module can be tuned to operate at a specific speed, less than full speed.

In another embodiment, a method of providing a Wireless Access Point includes providing a housing including a plurality of sides each adjacent to a bottom portion, wherein the base houses a plurality of components including a fan module, a Printed Circuit Board (PCB) including one or more Wi-Fi radios, and a power supply; and providing an electrical plug connected to the power supply and extending from the bottom portion for insertion into an electrical outlet for power and for physical support of the Wireless Access Point adjacent to the electrical plug.

In a further embodiment, a compact electronic device includes a base including a plurality of sides each adjacent to a bottom portion, wherein the base houses a plurality of components including a heatsink supporting a fan module located in an interior portion, a Printed Circuit Board (PCB), and a power supply, and wherein vents are disposed on the bottom portion and side vents are disposed on one or more of the plurality of sides; a top cover configured to attach to the base via the plurality of sides forming an air gap extending each of the plurality of sides, wherein the air gap supports air exhaust on one or more sides of the plurality of sides and air intake on the remaining sides of the plurality of one or more sides; and an electrical plug connected to the power supply and extending out of the bottom portion for insertion into an electrical outlet for power and to physically support the compact electronic device.

BRIEF DESCRIPTION OF THE DRAWINGS

The present disclosure is illustrated and described herein with reference to the various drawings, in which like reference numbers are used to denote like system components/ method steps, as appropriate, and in which.

DETAILED DESCRIPTION OF THE DISCLOSURE

The present disclosure relates to systems and methods for cooling a compact electronic device, such as a wireless access device. The compact electronic device can be a Wi-Fi Access Point (AP) or the like in a distributed Wi-Fi system. Physical features of the compact electronic device include a small form-factor with multiple sides, direct plug into an electrical outlet, internal power supply and fan, etc. To address the unique form-factor, the compact electronic device includes a unique form factor and layout for air flow, an air gap structure to use the same openings for air intake and exhaust, a layered structure for guiding air between layers, a fan located in an interior of the device, and the like. The design of the compact electronic device provides efficient cooling due to multiple air intake locations, quiet operation with the fan module disposed in the interior, long life, low cost, and compact size.

Referring to FIGS. 1-11, various diagrams include a compact electronic device 10 for illustration purposes. In an embodiment, the compact electronic device 10 is a wireless Access Point (AP), wireless access device, or equivalent. The compact electronic device 10 has a compact form-factor that is configured to directly plug into an electrical outlet. Accordingly, the form-factor is limited in size to ensure the compact electronic device 10 does not obstruct other electrical outlets and so that the weight of the compact electronic device 10 can be support by the electrical outlet and the plug. While illustrated as a wireless access device, those skilled in the art will recognize the systems and methods described herein can apply to any type of compact electronic device, including sensors, cameras, Internet of Things (IoT) devices, media playing devices, personal assistants, etc.

Figure 1:
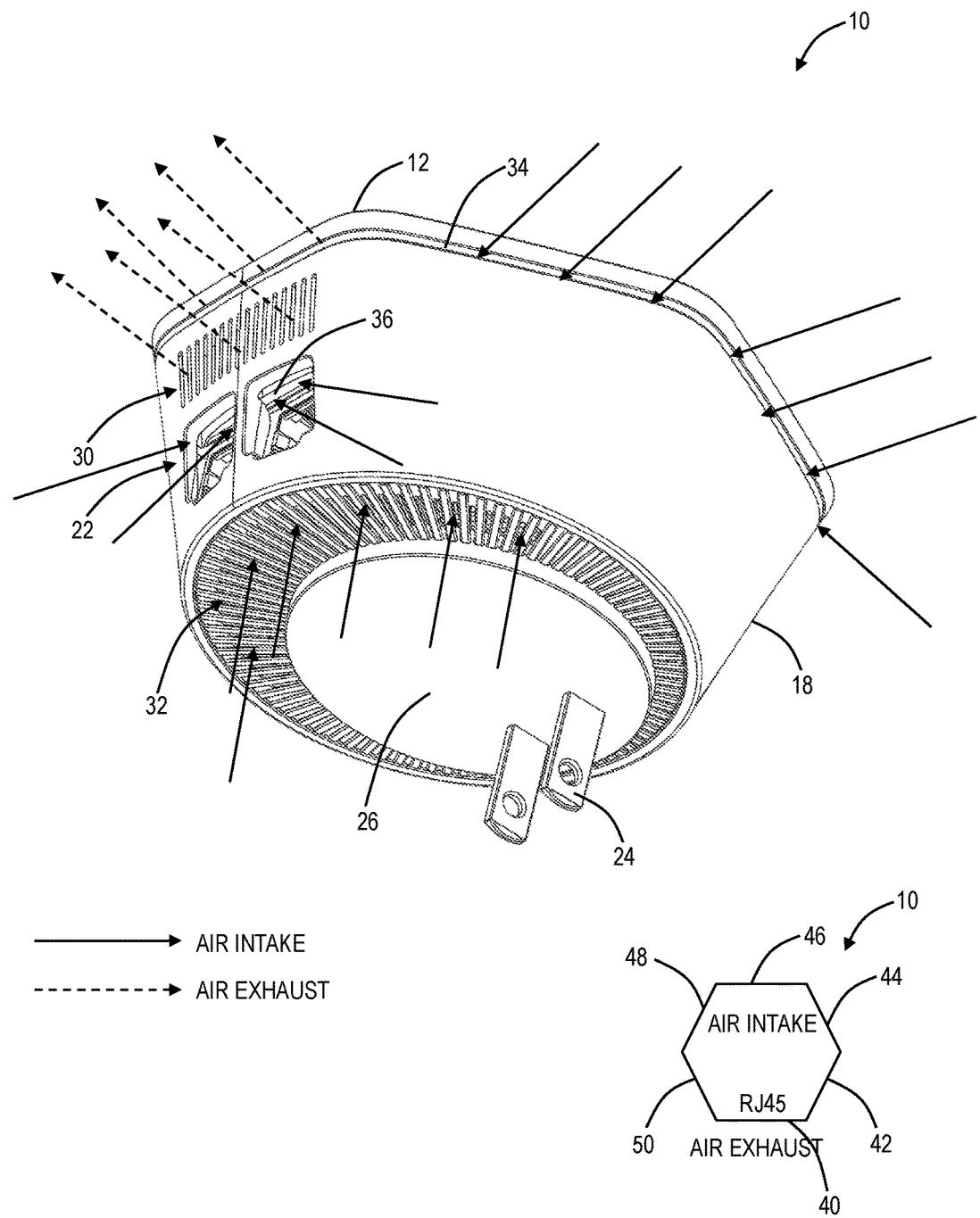
FIG. 1 is a perspective diagram of a compact electronic device.
Figure 2:
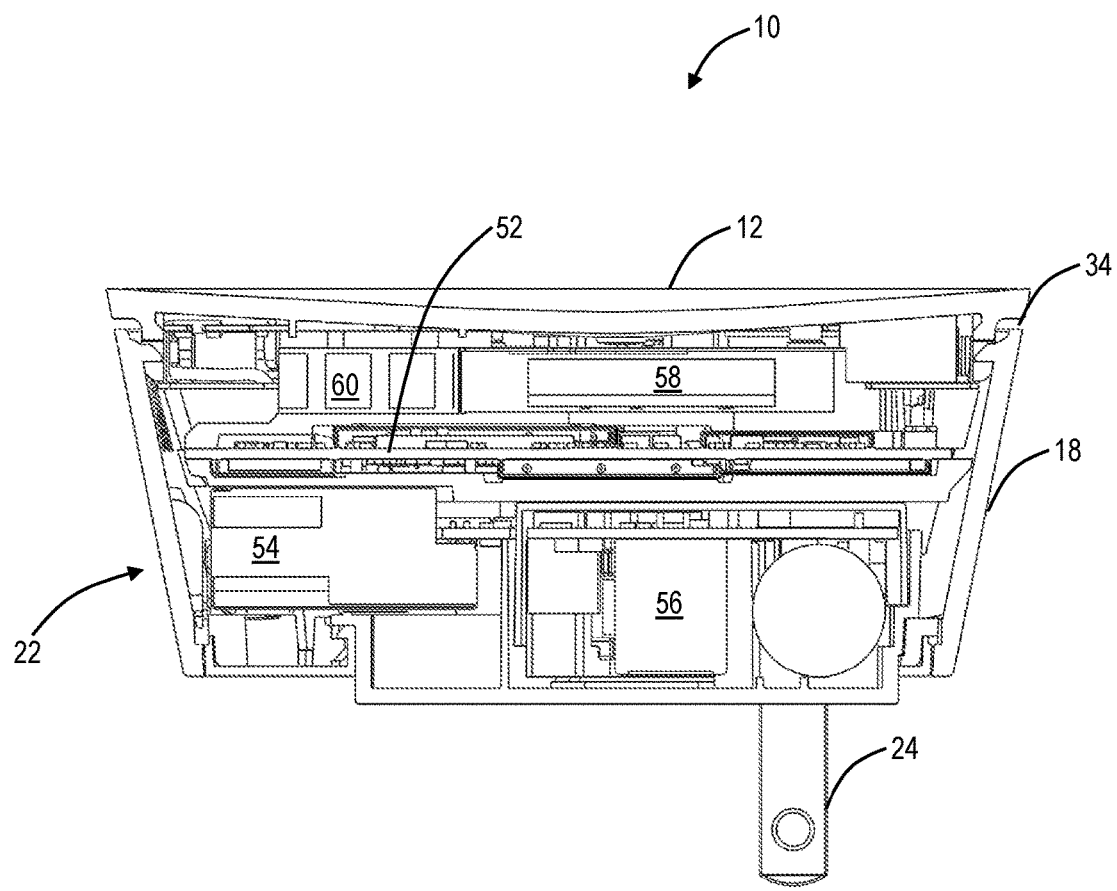
FIG. 2 is a cross-sectional diagram of the compact electronic device from the side.
Figure 3:
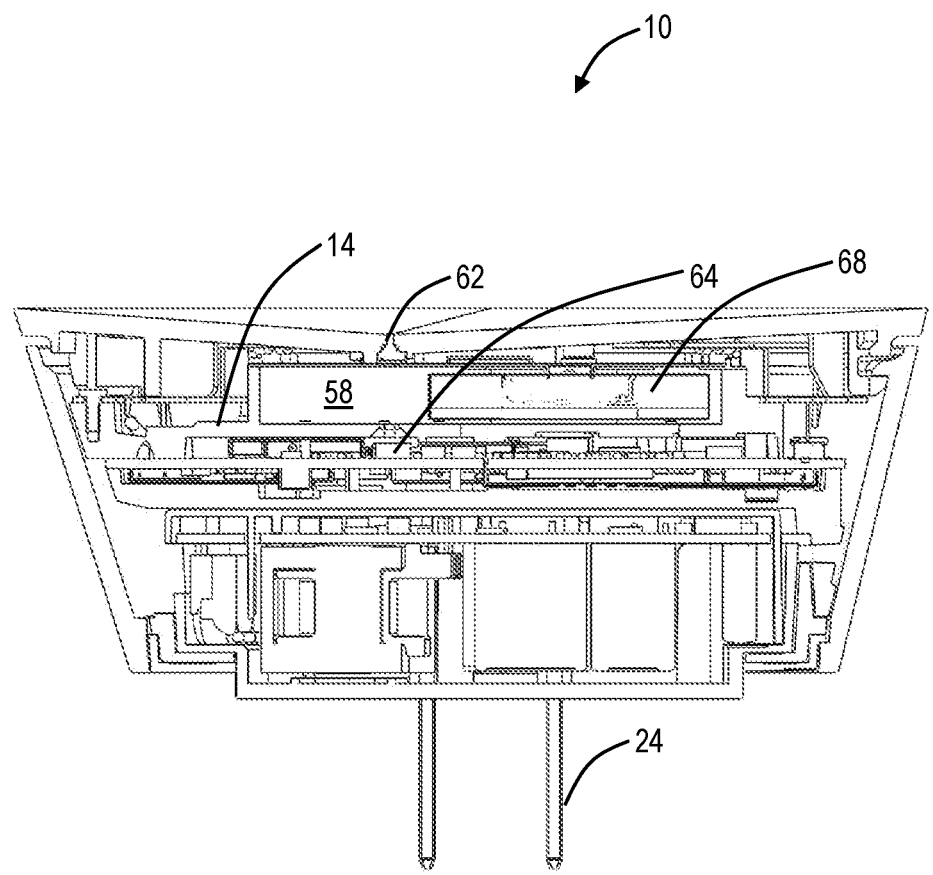
FIG. 3 is another cross-sectional diagram of the compact electronic device from the top.
Figure 4:
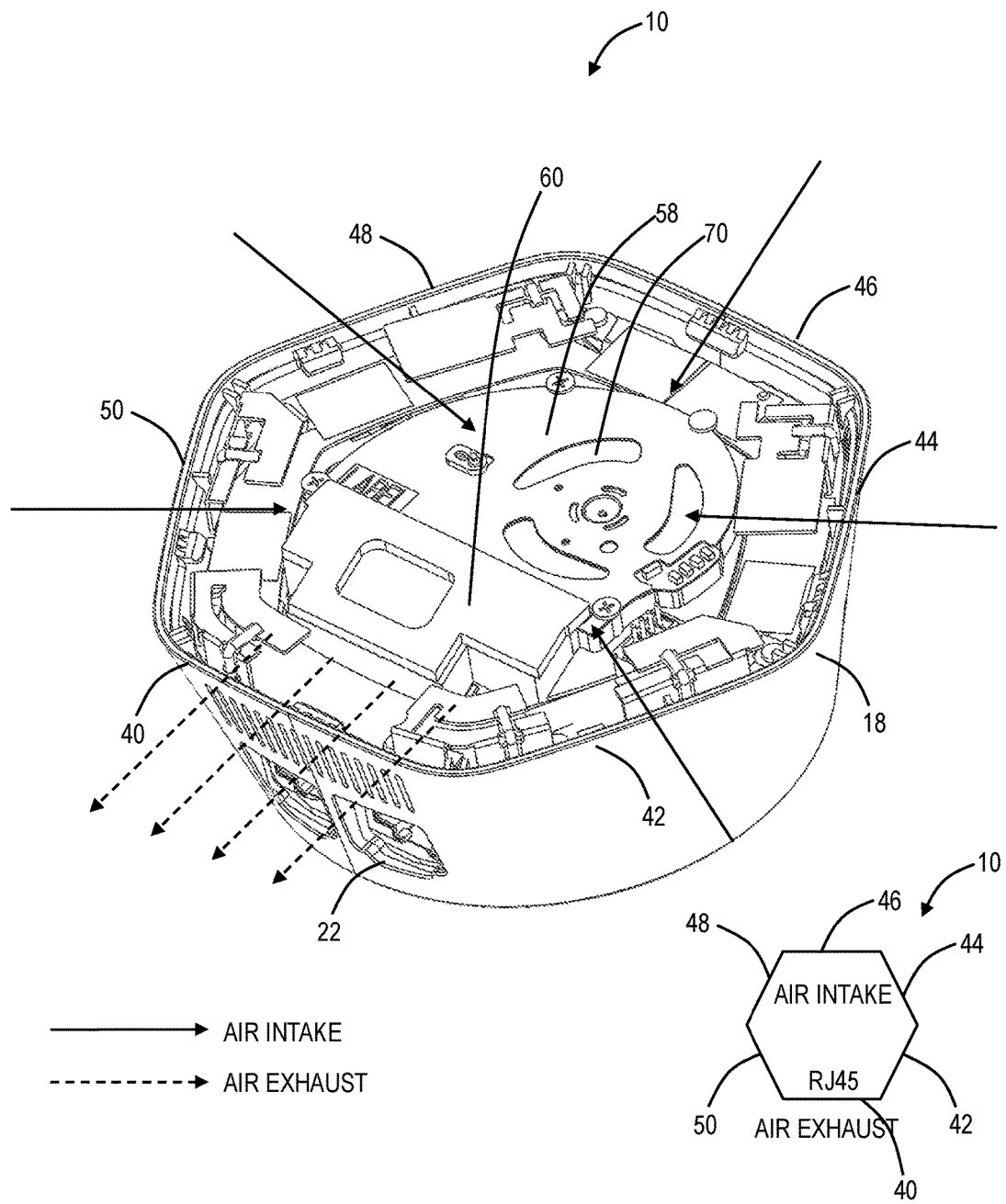
FIG. 4 is a perspective diagram of the compact electronic device with a top cover removed.
Figure 5:
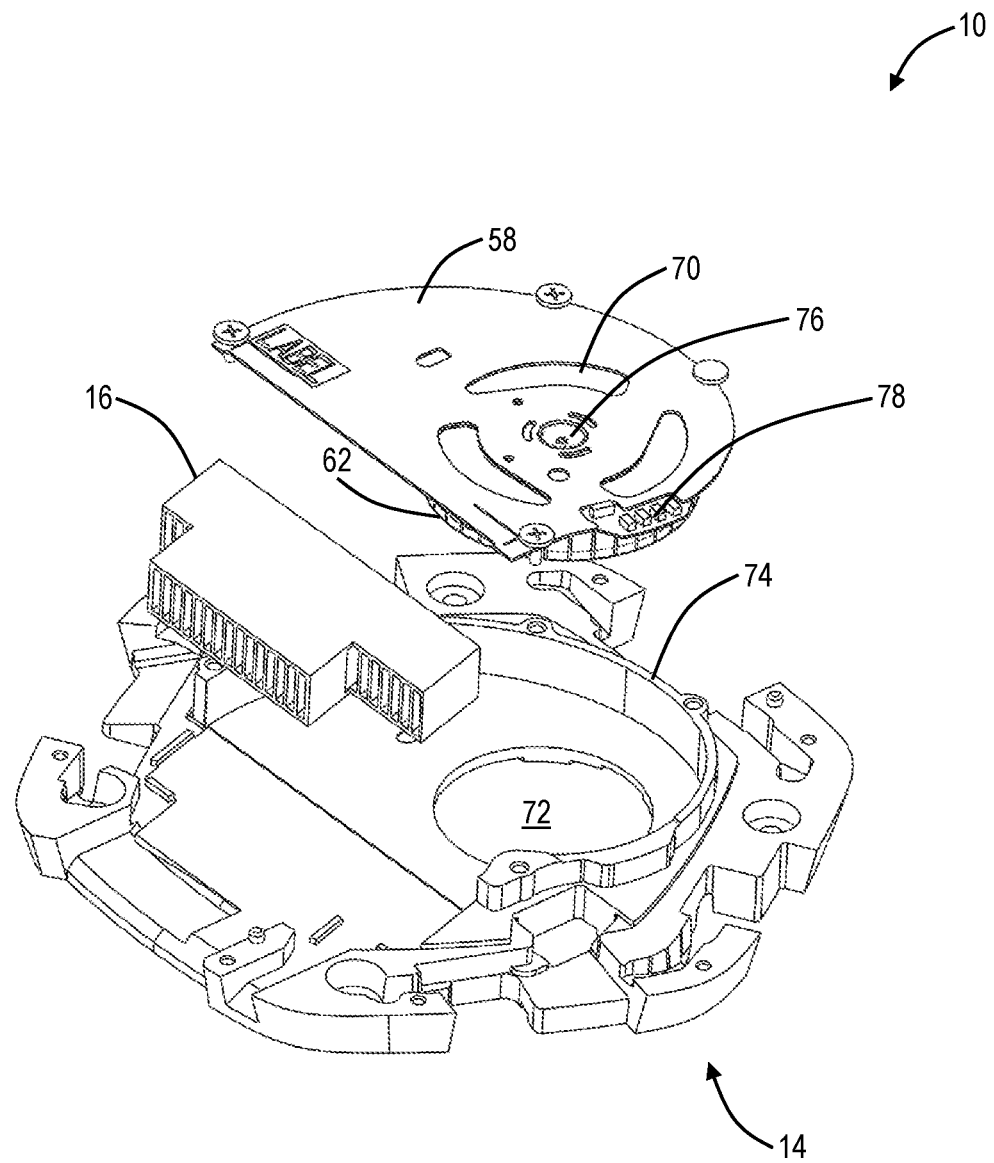
FIG. 5 is a perspective diagram of a heatsink and fan module for the compact electronic device.
Figure 6:
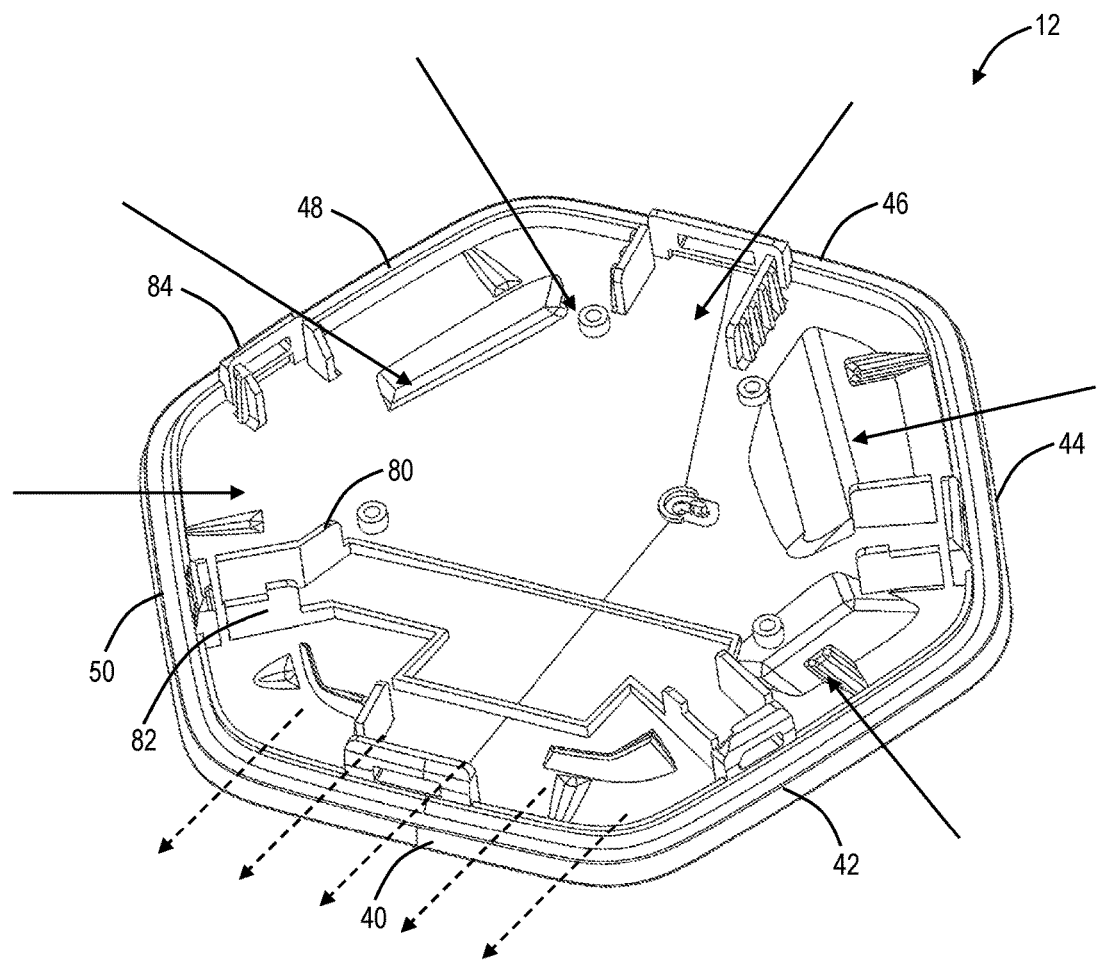
FIG. 6 is a perspective diagram of the interior portion of the top cover.
Figure 7:
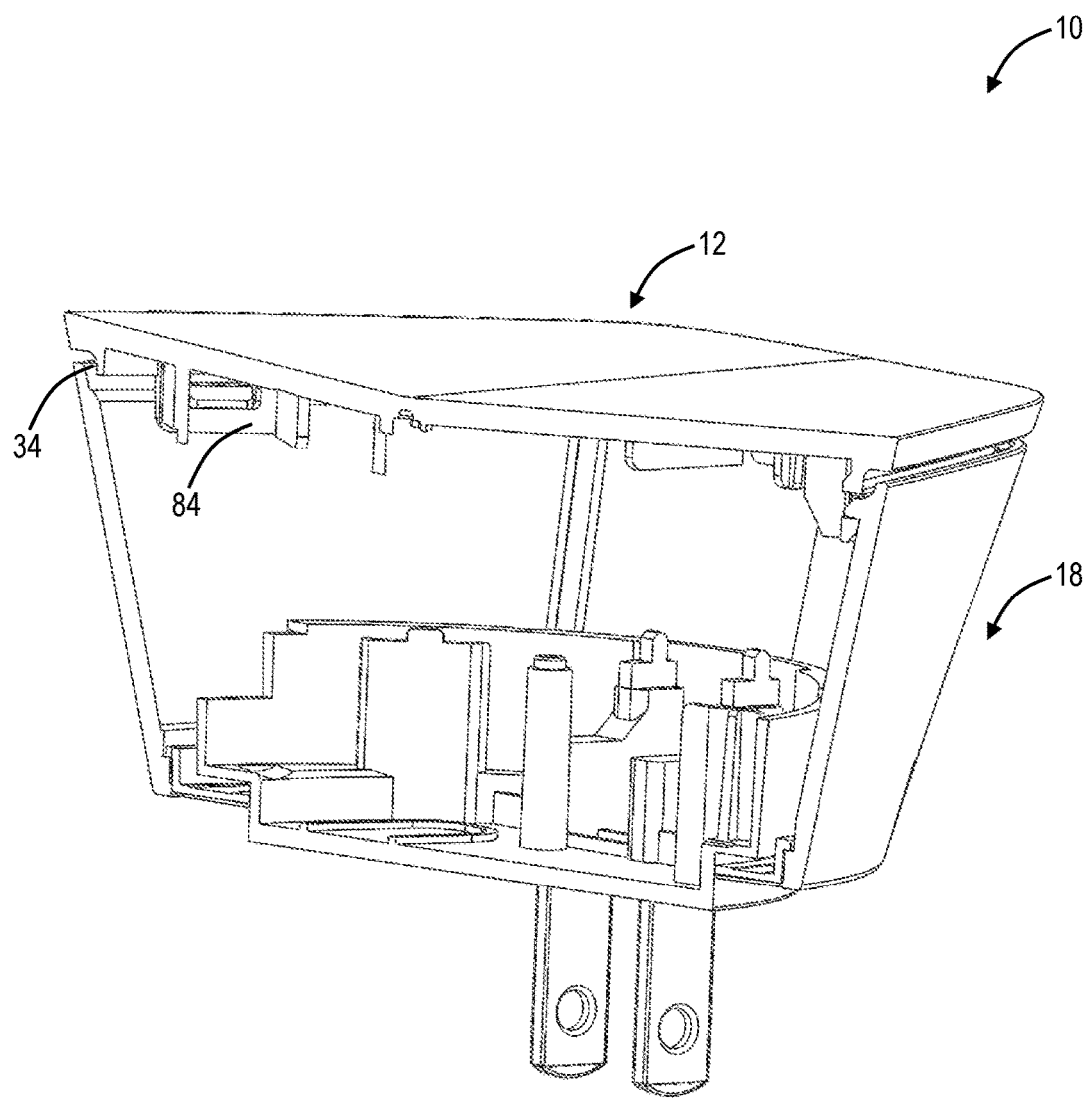
FIG. 7 is a cross-sectional diagram of the compact electronic device illustrating connectivity between the top cover and a base.
Figure 8:
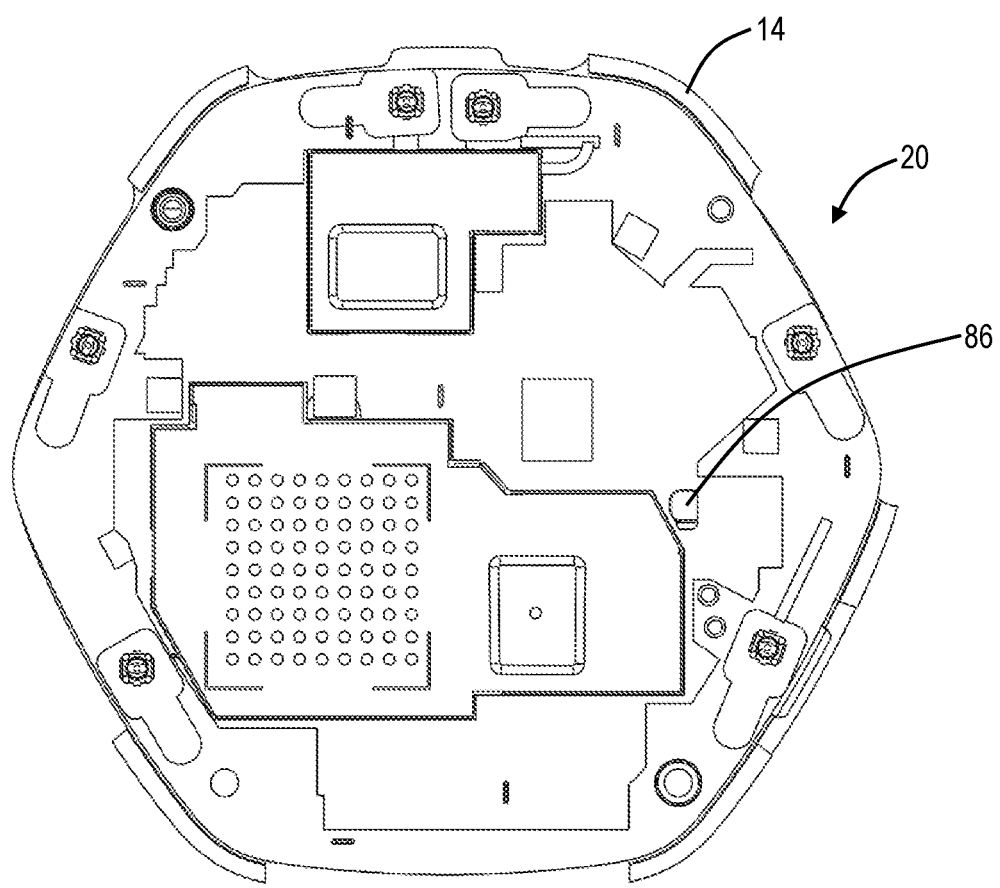
FIG. 8 is a bottom diagram of a Printed Circuit Board (PCB) in the compact electronic device and associated gaps for airflow.
Figure 9:
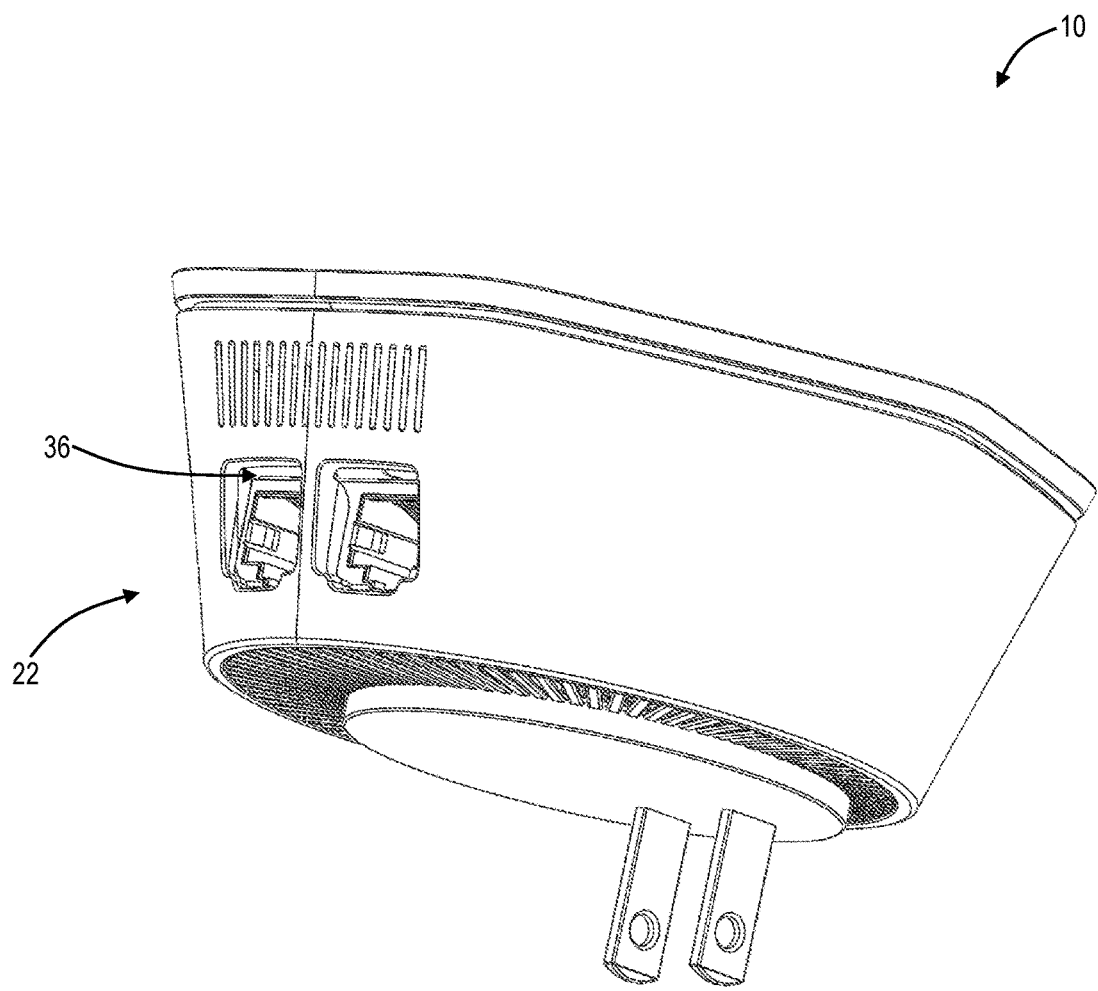
FIG. 9 is a perspective diagram of the compact electronic device illustrating RJ-45 ports used in part for airflow.
Figure 10:
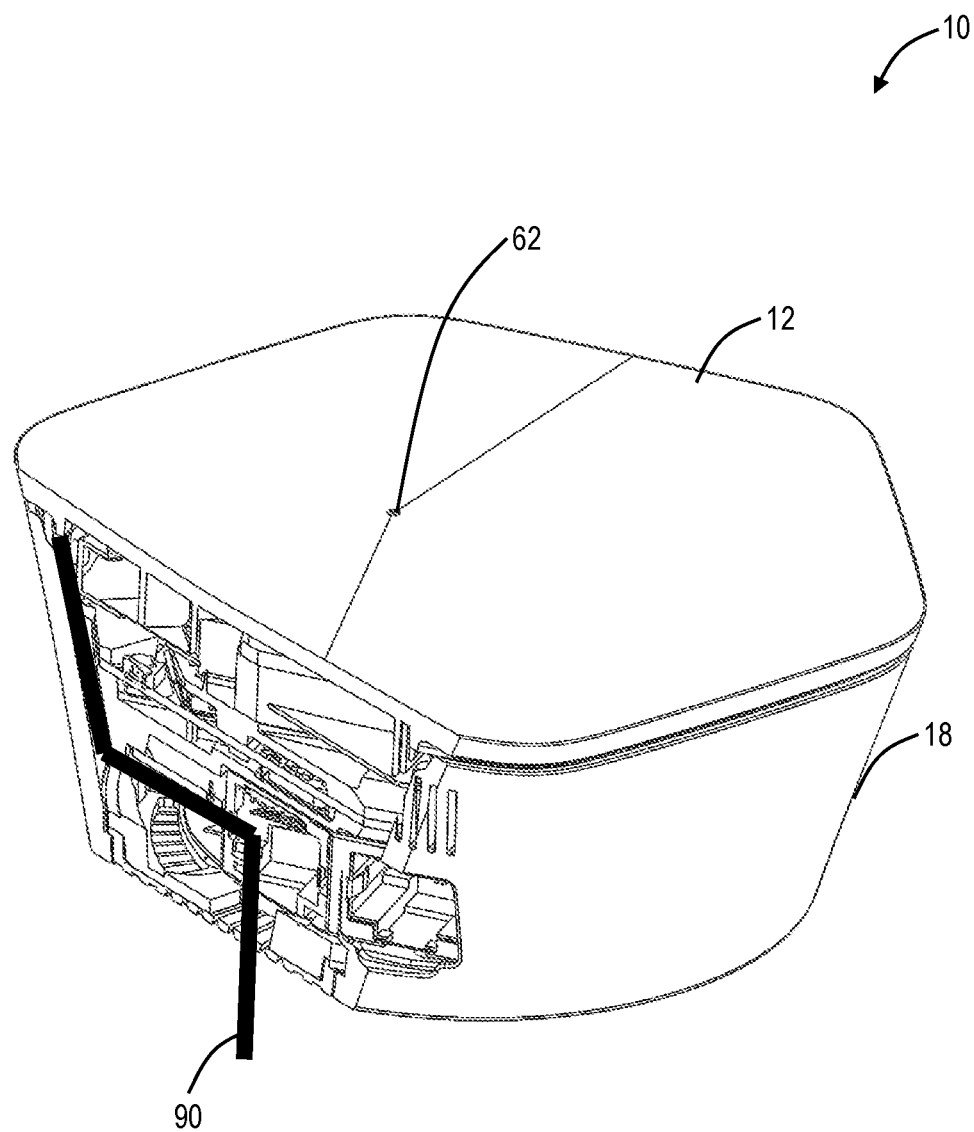
FIG. 10 is a cross-sectional diagram of the compact electronic device illustrating overall airflow.
Figure 11:
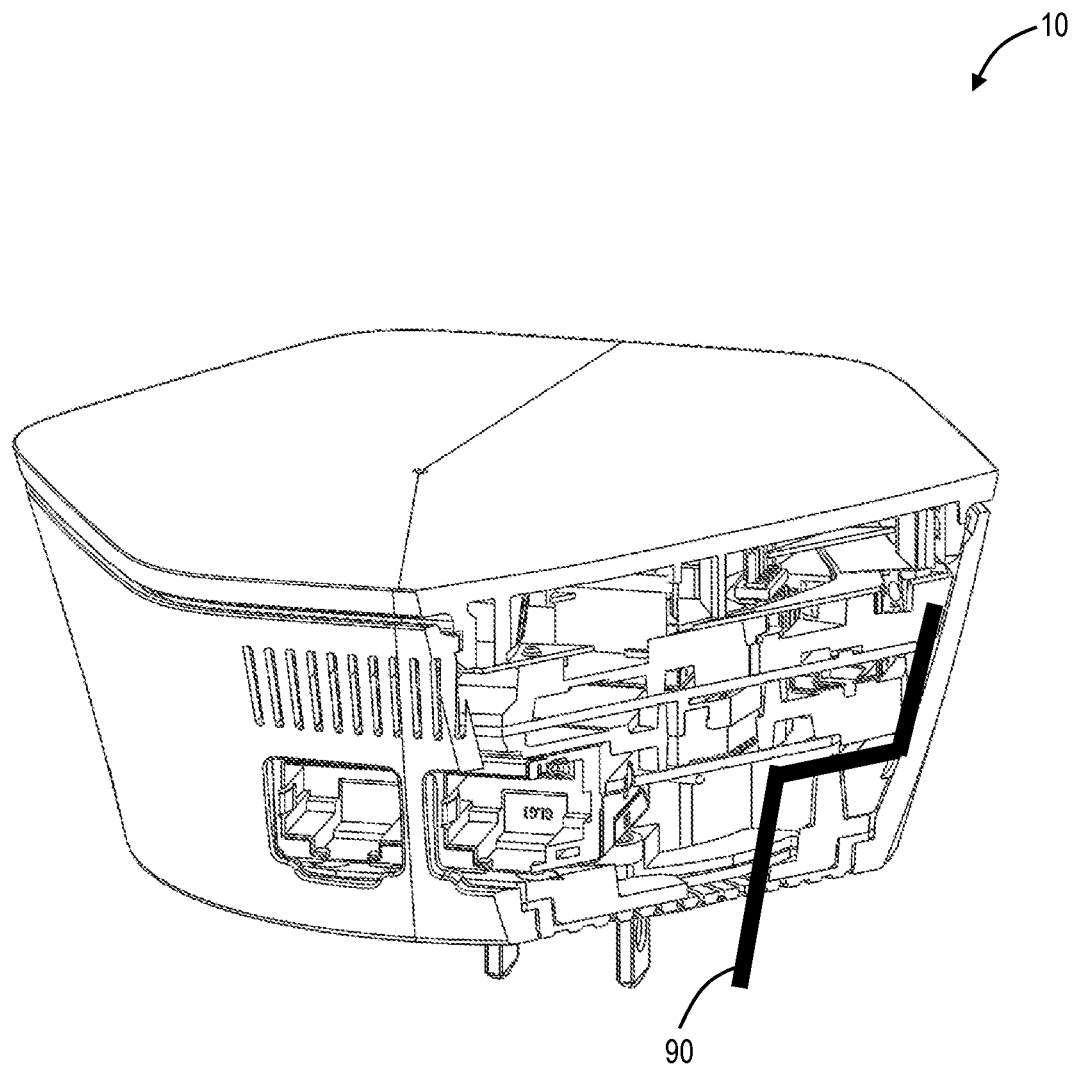
FIG. 11 is a different cross-sectional diagram of the compact electronic device illustrating overall airflow.

FIG. 1 is a perspective diagram of a compact electronic device 10. FIG. 2 is a cross-sectional diagram of the compact electronic device 10 from the side. FIG. 3 is another cross-sectional diagram of the compact electronic device 10 from the top. FIG. 4 is a perspective diagram of the compact electronic device 10 with a top cover 12 removed. FIG. 5 is a perspective diagram of a heatsink 14 and fan module for the compact electronic device 10. FIG. 6 is a perspective diagram of the interior portion of the top cover 12. FIG. 7 is a cross-sectional diagram of the compact electronic device 10 illustrating connectivity between the top cover 12 and a base 18. FIG. 8 is a bottom diagram of a Printed Circuit Board (PCB) 20 in the compact electronic device 10 and associated gaps for airflow. FIG. 9 is a perspective diagram of the compact electronic device 10 illustrating RJ-45 ports 22 (cable connector ports) used in part for airflow. FIG. 10 is a cross-sectional diagram of the compact electronic device 10 illustrating overall airflow. FIG. 11 is a different cross-sectional diagram of the compact electronic device 10 illustrating overall airflow.

In FIG. 1, the compact electronic device 10 includes the top cover 12 over the base 18 and an electrical plug 24 protruding from a bottom portion 26 of the base 18. The base 18 includes RJ-45 ports 22 which enable data connectivity to the compact electronic device 10, e.g., via Ethernet cables. The base 18 can include other types of wired ports which are omitted for illustration purposes. The base 18 can also include various openings for air intake and/or exhaust including vents 30 located on a side of the base 18, vents 32 located on the bottom portion 26, an air gap 34 at a lid between the top cover 12 and the base 18, and an air gap 36 in the RJ-45 ports.

Of note, all of the openings (the vents 30, the vents 32, the air gap 34, and the air gap 36) are hidden when the compact electronic device 10 is plugged into an electrical outlet. By hidden, the openings are not easily observed by a person looking at the compact electronic device 10. Further, having multiple openings for air intake (the vents 30, the air gap 34 on the sides 42-50, and the air gap 36) allows fresher, cooler air to come to the components near the respective vents.

The electrical plug 24 provides two functions, namely to connect electrically to a corresponding electrical outlet and to mechanically support the weight of the compact electronic device 10 while plugged into the electrical outlet. Thus, the bottom portion 26 will be disposed adjacent to a corresponding structure (e.g., wall) which has the electrical outlet (not shown). Accordingly, the vents 32 are recessed from the back 26 to allow a gap between the vents and the wall sufficient for airflow.

The base 18 can include a plurality of sides 40, 42, 44, 46, 48, 50. This is illustrated in FIG. 1 in a logical diagram. In an embodiment, the base 18 can have a hexagonal design, i.e., 6 sides. Of course, other embodiments are contemplated. The compact electronic device 10 uses different sides for air intake. FIG. 1 illustrates air flow in the compact electronic device 10 with air intake (cold or room temperature air) shown in solid lines and air exhaust (warm air) shown in dotted lines.

In an embodiment, the vents 30 and the air gap 34 on the side 40 are used for hot air exhaust while the vents 32, the air gap 34 on the other sides 42, 44, 46, 48, 50, and the air gap 36 are used for cold air intake. That is the air gap 34 are configured to segment between air intake and air exhaust based on the side 40-50. Additional details of the airflow within the compact electronic device 10 are described herein.

The top cover 12 can be snapped on the base 18 and can include the air gap 34 which is between the top cover 12 and the base 18. The air gap 34 is around on each side 40-50 and appears decorative or structural, i.e., not like a vent, and is hidden. The top cover 12 has structural elements which divide the air intake and air exhaust and the structural elements are double walled for improved isolation and to provide more resistance to air leaking from one side to the other and to provide a thermally isolating region between intake (cool air) and exhaust (hot air). There can be a division in the air gap 34 between the side 40 and the sides 42, 50 to separate air intake from air exhaust.

In FIG. 2, the compact electronic device 10 is illustrated in a cross-section to show internal components. The top cover 12 can snap in place with the base 18, such as via a tongue and groove snap. Internally, the compact electronic device 10 includes a PCB 20, an RJ45 port 54, a power supply 56, a fan module 58, and a fan fins module 60. The PCB 20 can include various electronic components which generate heat, such as Wi-Fi chipsets. The RJ45 port 54 includes connectivity for the RJ45 port 22 including an opening for a cable connector. The power supply 56 provides power to all of the components and is connected to the electrical plug 24.

Again, in an embodiment, the compact electronic device 10 is a Wi-Fi access point. Advantageously, this embodiment includes the Wi-Fi access point directly plugging into the electrical outlet in combination with an internal fan and internal power supply.

In FIG. 3, the compact electronic device 10 is illustrated in a cross-section to show a Light Emitting Diode (LED) light guide 62 for an LED 64 disposed on the PCB 20. There is a heatsink 14 which physically supports the fan module 58. The heatsink 14 is disposed above the PCB 20. There is an empty cavity inside of the fan module 58 and the heatsink 14 allowing the LED 64 to shine through without interference. The fan module 58 includes fan blades 68 which do not interfere with the LED 64. The light guide or light pipe above the LED guides the light from the LED to the hole in the lid so that the light is visible. In addition, the light pipe, often a tubular piece of clear plastic, also seals the hole in the housing, preventing cooling air from escaping from the hole.

In FIG. 4, the top cover 12 is removed for illustration. Again, solid line arrows illustrate air intake through the air gap 34 and dotted line arrows illustrate air exhaust through the air gap 34. The fan module 58 is configured to draw air for the air intake into gaps 70 between a middle enclosure and the top cover 12 and to blow the air exhaust via the fan fins module 60. The cool air circulated from the fan module 58 passes through the fan fins module 60 and out the exhaust.

In FIG. 5, the heatsink 14 is illustrated with the fan module 58 and the fan fins module 60 illustrated separately. The heatsink 14 is also a heatspreader and FIG. 5 includes three assemblies/components—the heatsink 14, the fan module 58, and the fan fins module 60. The heatsink 14 sits above the PCB 20 and includes an opening 72 which allows air to the PCB 20 and a wall 74 for supporting the fan module 58. There is cost savings by having the wall 74 integral to the heatsink 14 (molded in the same step) as part of the fan shroud.

The fan module 58 includes the fan blades 62 which are driven by a fan motor 76, the openings 72 for airflow, and a fan PCB 78 for control of the fan module 58. The fan module 58 can be physically attached to the heatsink 14, such as via screws. The fan PCB 78 can be factory tuned for the fan speed to make all devices 10 have the same sound, and cooling behavior (fans as delivered from the manufacturer have varying speed even when operating at the same voltage). The fan PCB 78 can also include a temperature monitor which monitors device 10 temperature and can provide this data periodically to a controller for adjustments. Further, the fan speed of the fan module 58 can be adjusted to maximize life, minimize noise, reduce power, etc. based on the monitored temperature. For example, the device 10 can be plugged in a residence, such as in a bedroom, living room, etc. It is important that the fan module 58 does not cause too much ambient noise. To that end, the tuning can be to set the speed to avoid noise above a certain threshold.

The fan fins module 60 includes directive fins for channeling air exhaust from the fan module 58 out the air exhaust openings, i.e., the air gap 34 on the side 40 and the vents 30. The fan fins module 60 can be physically attached to the heatsink 14, such as directly soldered. Note, the fan fins module 60 can be part of the heatsink 14, but soldered down to provide excellent thermal contact to the heatsink 14. The cost of the entire assembly can be reduced by having the fins constructed separately from the fan module and attached, preferably by soldering to provide the best thermal conduction. The fins are designed to align the direction of the air exhaust, out the vents 30 and the air gap 34 on the side 40, specifically spaced to optimize airflow and cooling.

Note, the fan module 58 is disposed in the middle of the compact electronic device 10 to minimize noise while operation and further is away from both the air intake openings (the vents 32, the air gap 34 in the sides 42-50, and the air gap 36) and the air exhaust openings (the vents 30 and the air gap 34 in the side 40). This configuration ensures airflow through the compact electronic device 10.

In FIG. 6, the interior side of the top cover 12 is illustrated. Again, solid line arrows illustrate air intake through the air gap 34 and dotted line arrows illustrate air exhaust through the air gap 34. Specifically, FIG. 6 illustrates the structural elements in the top cover 12 which divide the air intake and air exhaust. The top cover 12 includes divider walls 80, 82 for a double wall configuration to improve isolation between the air intake and the air exhaust. The divider walls 80 separate the air exhaust on the side 40 from the air intake on the sides 42-50. This ensures that the cool air intake does not mix with the hot air exhaust for maximum cooling efficiency.

In FIG. 7, a cross-sectional diagram illustrates the top cover 12 connected to the base 18 with the other components omitted for illustration purposes. FIG. 7 illustrates the connectivity between the top cover 12 and the base 18 and the formation of the air gap 34. The top cover 12 includes one or more extension 84 on each side which can snap to corresponding grooves in the base 18. The air gap 34 is formed since the top cover 12 is not sealed to the base 18, i.e., the physical connectivity between the top cover 12 and the base 18 is via the extension 84.

In FIG. 8, the PCB 20 is illustrated from the bottom, i.e., the heatsink 14 is above the PCB 20 logically in FIG. 8. The PCB 20 includes an opening 86 (and there is a corresponding opening in the heatsink 14). The opening 86 allows airflow from below to pass through the PCB 20.

In FIG. 9, the air gap 36 in the RJ-45 ports 22 is illustrated. Specifically, the air gap 36 is formed to allow airflow out the RJ-45 ports 22.

In FIGS. 10 and 11, cross-sectional diagrams illustrate a "Z" airflow from the vents 30 through the compact electronic device 10. Airflow is illustrated with solid lines 90. The air flows from the vents 30 (vents) on the bottom portion 26 bringing some heat away from the PCB 20 and flowing out of the opening 86 meeting cool air coming in from the air gap 34 and circulating through the fan module 58.

Note, the air gap 34 can also function as a slot antenna which has an opening. The air can flow through the slot antenna as well as the gaps in the heat sinks. Air is guided from layer to layer via gaps in the edges of the heat sinks. One of the air guides is the air gap 34. The air flow follows a "Z" pattern as indicated in FIGS. 10 and 11. The configuration guides air through hottest portion of the design last.

Figure 12:
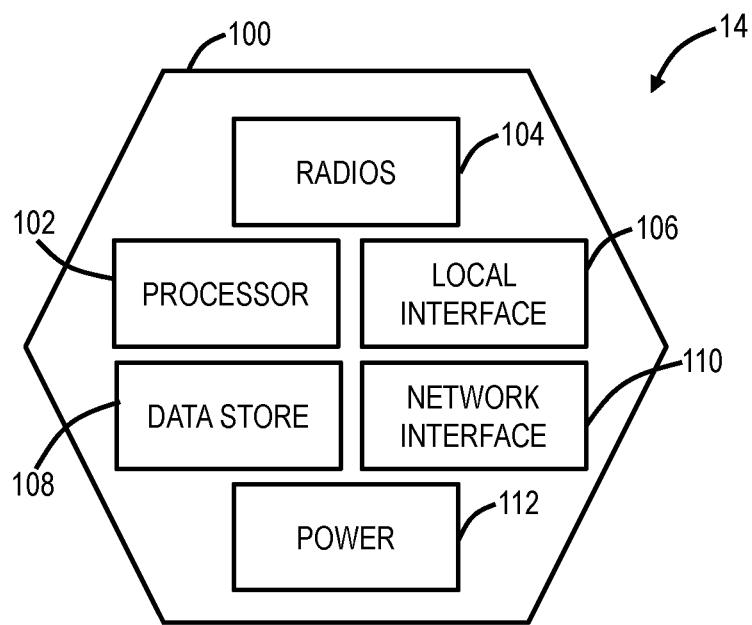
FIG. 12 is a block diagram of functional components of the compact electronic device configured as a wireless access point.

FIG. 12 is a block diagram of functional components of the compact electronic device 10 configured as a wireless access point. The access point includes a physical form factor 100 as described herein which contains a processor 102, a plurality of radios 104, a local interface 106, a data store 108, a network interface 110, and power 112. It should be appreciated by those of ordinary skill in the art that FIG. 12 depicts the access point in an oversimplified manner, and a practical embodiment may include additional components and suitably configured processing logic to support features described herein or known or conventional operating features that are not described in detail herein.

In an embodiment, the form factor 100 is a compact physical implementation where the access point directly plugs into an electrical outlet and is physically supported by the electrical plug connected to the electrical outlet. This compact physical implementation is ideal for a large number of access points distributed throughout a residence. The processor 102 is a hardware device for executing software instructions. The processor 102 can be any custom made or commercially available processor, a central processing unit (CPU), an auxiliary processor among several processors, a semiconductor-based microprocessor (in the form of a microchip or chip set), or generally any device for executing software instructions. When the access point is in operation, the processor 102 is configured to execute software stored within memory or the data store 108, to communicate data to and from the memory or the data store 108, and to generally control operations of the access point pursuant to the software instructions. In an embodiment, the processor 102 may include a mobile-optimized processor such as optimized for power consumption and mobile applications.

The radios 104 enable wireless communication. The radios 104 can operate according to the IEEE 802.11 standard. The radios 104 include address, control, and/or data connections to enable appropriate communications on a Wi-Fi system. The access point can include a plurality of radios to support different links, i.e., backhaul links and client links. In an embodiment, the access points support dual-band operation simultaneously operating 2.4 GHz and 5 GHz 2×2 MIMO 802.11b/g/n/ac radios having operating bandwidths of 20/40 MHz for 2.4 GHz and 20/40/80 MHz for 5 GHz. For example, the access points can support IEEE 802.11AC1200 gigabit Wi-Fi (300+867 Mbps).

The local interface 106 is configured for local communication to the access point and can be either a wired connection or wireless connection such as Bluetooth or the like. The data store 108 is used to store data. The data store 108 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 108 may incorporate electronic, magnetic, optical, and/or other types of storage media.

The network interface 110 provides wired connectivity to the access point. For example, the network interface 110 can include the RJ-45 ports 22. The network interface 110 may be used to enable the access point to communicate to a modem/router. Also, the network interface 110 can be used to provide local connectivity to a Wi-Fi client device. For example, wiring in a device to an access point can provide network access to a device which does not support Wi-Fi. The network interface 110 may include, for example, an Ethernet card or adapter (e.g., 10BaseT, Fast Ethernet, Gigabit Ethernet, 10 GbE). The network interface 110 may include address, control, and/or data connections to enable appropriate communications on the network.

The processor 102 and the data store 108 can include software and/or firmware which essentially controls the operation of the access point, data gathering and measurement control, data management, memory management, and communication and control interfaces with a server via the cloud. The processor 102 and the data store 108 may be configured to implement the various processes, algorithms, methods, techniques, etc. described herein. For example, the processor 102 can be communicatively coupled to the fan PCB 78.

In an embodiment, a compact electronic device includes a base including a plurality of sides each adjacent to a bottom portion, wherein the base houses a plurality of components including a heatsink supporting a fan module located in an interior portion, a Printed Circuit Board (PCB), and a power supply, and wherein vents are disposed on the bottom portion and side vents are disposed on one or more of the plurality of sides, such that the vents are not visible to a normal observer when the device is plugged into the electrical outlet; a top cover configured to attach to the base via the plurality of sides forming an air gap extending each of the plurality of sides, wherein the air gap supports air exhaust on one or more sides of the plurality of sides and air intake on the remaining sides of the plurality of one or more sides; and an electrical plug connected to the power supply and extending out of the bottom portion for insertion into an electrical outlet for power and to physically support the compact electronic device. The compact electronic device can include a Wireless Access Point.

The top cover can include extensions which snap in place to respective sides on the base. The top cover can include a double wall which divides airflow between the air exhaust on the one or more side and the air intake on the remaining sides, the double wall including two substantially shaped walls spaced apart and formed in the top cover. The air intake from the vents can be guided between layers of the plurality of components via gaps in edges of the heat sink. The air intake from the vents can be a Z-shaped flow through the base. The air gap can further operate as a slot antenna. The compact electronic device can further include one or more cable connector ports each with a second air gap for the air intake. The fan module can be disposed adjacent to fins attached to the heatsink, wherein the fins direct the air exhaust. The PCB can include an opening for airflow from the vents to the fan module located above the PCB.

In a further embodiment, a method of providing a compact electronic device includes providing a base including a plurality of sides each adjacent to a bottom portion, wherein the base houses a plurality of components including a heatsink supporting a fan module located in an interior portion, a Printed Circuit Board (PCB), and a power supply, and wherein vents are disposed on the bottom portion and side vents are disposed on one or more of the plurality of sides; providing a top cover configured to attach to the base via the plurality of sides forming an air gap extending each of the plurality of sides, wherein the air gap supports air exhaust on one or more sides of the plurality of sides and air intake on the remaining sides of the plurality of one or more sides; and providing an electrical plug connected to the power supply and extending out of the bottom portion for insertion into an electrical outlet for power and to physically support the compact electronic device.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A Wireless Access Point, comprising:
   a housing comprising a plurality of sides each adjacent to a bottom portion, wherein the housing houses a plurality of components comprising a fan module, a Printed Circuit Board (PCB) comprising one or more Wi-Fi radios, and a power supply;
   an electrical plug connected to the power supply and extending from the bottom portion for insertion into an electrical outlet for power and for physical support of the Wireless Access Point adjacent to the electrical plug;
   vents disposed on the housing on a surface that is recessed from the bottom portion with the electrical plug to provide a gap for air circulation; and
   a heatsink supporting the fan module, wherein the fan module is located in an interior of the housing, wherein air intake from the vents is guided between layers of the plurality of components via gaps in edges of the heat sink.

2. The Wireless Access Point of claim 1, further comprising:
   a plurality of vents disposed about the housing which are hidden from view when the Wireless Access Point is plugged into the electrical plug.

3. The wireless Access Point of claim 1, further comprising:
   a top portion disposed to or attached to the housing at the plurality of sides, wherein an air gap is formed between the top portion and the housing, wherein the air gap supports air flow for cooling the device.

4. The Wireless Access Point of claim 3, wherein the top portion comprises a wall which divides airflow between the air exhaust on the one or more side and the air intake on the remaining sides, and wherein the wall is formed in the top portion.

5. The Wireless Access Point of claim 1, further comprising:
   a top portion disposed to or attached to the housing at the plurality of sides, wherein an air gap is formed between the top portion and the housing, wherein the air gap supports air exhaust on one or more sides of the plurality of sides and air intake on the remaining sides of the plurality of one or more sides.

6. The Wireless Access Point of claim 1, wherein an air gap further operates as a slot antenna.

7. The Wireless Access Point of claim 1, wherein air which is taken from the vents flows through the housing in a Z-shaped manner to an air gap between the housing and a top portion disposed to or attached to the housing.

8. The Wireless Access Point of claim 1, wherein the PCB comprises an opening for airflow from the vents to the fan module located above the PCB.

9. The Wireless Access Point of claim 1, wherein the fan module is disposed adjacent to fins attached or soldered to the heatsink, wherein the fins direct the air exhaust.

10. The Wireless Access Point of claim 9, wherein a fan and fan shroud are a separate assembly from the fins.

11. The Wireless Access Point of claim 1, wherein a wall associated with the heatsink is utilized as a portion of a fan shroud for the fan module.

12. The Wireless Access Point of claim 1, further comprising:
    one or more cable connector ports on the housing each with an air gap for air intake.

13. The Wireless Access Point of claim 1, wherein a Light Emitting Diode (LED) is positioned on the PCB and configured to shine through holes in the fan module.

14. The Wireless Access Point of claim 13, wherein the LED shines through a hole in the housing which is sealed off from leakage by a light pipe.

15. The Wireless Access Point of claim 1, wherein the fan module is tuned to operate at a specific speed, less than full speed.

16. A compact electronic device, comprising:
    a base comprising a plurality of sides each adjacent to a bottom portion, wherein the base houses a plurality of components comprising a heatsink supporting a fan module located in an interior portion, a Printed Circuit Board (PCB), and a power supply, and wherein vents are disposed on the bottom portion and side vents are disposed on one or more of the plurality of sides;
    a top cover configured to attach to the base via the plurality of sides forming an air gap extending each of the plurality of sides, wherein the air gap supports air exhaust on one or more sides of the plurality of sides and air intake on the remaining sides of the plurality of one or more sides; and
    an electrical plug connected to the power supply and extending out of the bottom portion for insertion into an electrical outlet for power and to physically support the compact electronic device.

17. A Wireless Access Point, comprising:
    a housing comprising a plurality of sides each adjacent to a bottom portion, wherein the housing houses a plurality of components comprising a fan module, a Printed Circuit Board (PCB) comprising one or more Wi-Fi radios, and a power supply;
    an electrical plug connected to the power supply and extending from the bottom portion for insertion into an electrical outlet for power and for physical support of the Wireless Access Point adjacent to the electrical plug;
    a top portion disposed to or attached to the housing at the plurality of sides, wherein an air gap is formed between the top portion and the housing;
    vents disposed on the housing on a surface that is recessed from the bottom portion with the electrical plug to provide a gap for air circulation,
    wherein air which is taken from the vents flows through the housing in a Z-shaped manner to the air gap.

18. The Wireless Access Point of claim 17, further comprising:
    a heatsink supporting the fan module, wherein the fan module is located in an interior of the housing.

* * * * *